US012729110B2

(12) United States Patent
Allegato et al.

(10) Patent No.: US 12,729,110 B2
(45) Date of Patent: Sep. 8, 2026

(54) MEMS DEVICE WITH AN IMPROVED CAP AND RELATED MANUFACTURING PROCESS

(71) Applicant: STMICROELECTRONICS S.r.l., Agrate Brianza (IT)

(72) Inventors: Giorgio Allegato, Monza (IT); Silvia Nicoli, Briosco (IT); Anna Alessandri, Vimercate (IT); Matteo Garavaglia, Magenta (IT)

(73) Assignee: STMICROELECTRONICS S.r.l., Agrate Brianza (IT)

( * ) Notice: Subject to any disclaimer, the term of this patent is extended or adjusted under 35 U.S.C. 154(b) by 400 days.

(21) Appl. No.: 18/359,754

(22) Filed: Jul. 26, 2023

(65) Prior Publication Data

US 2024/0043265 A1 Feb. 8, 2024

(30) Foreign Application Priority Data

Aug. 3, 2022 (IT) ........................ 102022000016536

(51) Int. Cl.
*B81B 7/00* (2006.01)
*B81C 1/00* (2006.01)

(52) U.S. Cl.
CPC ........ *B81B 7/0022* (2013.01); *B81C 1/00269* (2013.01); *B81B 2201/0228* (2013.01); *B81B 2203/0315* (2013.01); *B81B 2207/053* (2013.01); *B81C 2203/0109* (2013.01); *B81C 2203/0154* (2013.01); *B81C 2203/038* (2013.01)

(58) Field of Classification Search
CPC ................ B81B 7/0022; B81B 7/0064; B81B 2201/0228; B81B 2203/0315; B81B 2207/053; B81B 2201/0235; B81B 2207/097; B81C 1/00269;
(Continued)

(56) References Cited

U.S. PATENT DOCUMENTS 8,316,718 B2 11/2012 Lin et al.
9,249,010 B2 * 2/2016 Raleigh ................ B81B 7/0064
(Continued)

FOREIGN PATENT DOCUMENTS

CN 105940287 A 9/2016
CN 106101975 A 11/2016

OTHER PUBLICATIONS

Jourdain et al., "Influence of 0-level packaging on the microwave performance of RF-1 MEMS devices," 31st European Microwave Conference, London, 2001, pp. 403-406.

*Primary Examiner* — Moazzam Hossain
(74) *Attorney, Agent, or Firm* — Seed IP Law Group LLP

(57) ABSTRACT

Electronic device including: a MEMS sensor device including a functional structure which transduces a chemical or physical quantity into a corresponding electrical quantity; a cap including a semiconductive substrate; and a bonding dielectric region, which mechanically couples the cap to the MEMS sensor device. The cap further includes a conductive region, which extends between the semiconductive substrate and the MEMS sensor device and includes: a first portion, which is arranged laterally with respect to the semiconductive substrate and is exposed, so as to be electrically coupleable to a terminal at a reference potential by a corresponding wire bonding; and a second portion, which contacts the semiconductive substrate.

23 Claims, 15 Drawing Sheets

(58) Field of Classification Search
CPC .... B81C 2203/0109; B81C 2203/0154; B81C 2203/038; B81C 2203/0118
See application file for complete search history.

(56) References Cited

U.S. PATENT DOCUMENTS

| | | | | |
|---|---|---|---|---|
| 2008/0290490 | A1* | 11/2008 | Fujii | B81B 7/007 257/E23.18 |
| 2010/0052082 | A1 | 3/2010 | Lee et al. | |
| 2011/0126632 | A1 | 6/2011 | McNeil et al. | |
| 2012/0001276 | A1* | 1/2012 | Huang | B81B 7/0064 257/416 |
| 2012/0260747 | A1 | 10/2012 | Chen et al. | |
| 2013/0001710 | A1 | 1/2013 | Daneman et al. | |
| 2013/0221457 | A1 | 8/2013 | Conti et al. | |
| 2014/0338459 | A1 | 11/2014 | Besling et al. | |
| 2015/0001651 | A1 | 1/2015 | Faralli et al. | |
| 2015/0091153 | A1 | 4/2015 | Liu et al. | |
| 2015/0102434 | A1 | 4/2015 | Maggi et al. | |
| 2015/0166333 | A1 | 6/2015 | Li et al. | |
| 2015/0375995 | A1 | 12/2015 | Steimle et al. | |
| 2016/0244325 | A1 | 8/2016 | Cheng et al. | |
| 2016/0304336 | A1 | 10/2016 | Schoen et al. | |
| 2016/0327446 | A1 | 11/2016 | Classen et al. | |
| 2017/0081179 | A1* | 3/2017 | Dawson | B81C 1/00309 |
| 2017/0210618 | A1 | 7/2017 | Chang et al. | |
| 2018/0282152 | A1* | 10/2018 | Duqi | B81C 1/00222 |
| 2021/0403316 | A1* | 12/2021 | Fukumitsu | H03H 9/02 |

* cited by examiner

MEMS DEVICE WITH AN IMPROVED CAP AND RELATED MANUFACTURING PROCESS

BACKGROUND

Technical Field

The present disclosure relates to a micro-electro-mechanical-system (MEMS) device with an improved cap and to the corresponding manufacturing process.

Description of the Related Art

It is known how the electrical performances of a MEMS device may degrade over time, if the so-called cap, which is part of the corresponding package, is not properly grounded. In fact, in the event that the cap is floating, undesired electric discharges may occur, which may damage the MEMS device. Furthermore, the presence of a floating cap may cause a reduction of the performances of MEMS devices such as, for example, MEMS inertial sensors, due to the onset of undesired electrostatic forces acting on the relative movable masses.

For these reasons, solutions are known which provide for protecting MEMS devices, and ASIC circuits coupled thereto, by integrating corresponding protection components (e.g., diodes), however the integration of these protection components is technologically complex and not always possible.

According to other solutions, the cap, of semiconductor material, is covered during the so-called "back-end" operations with a conductive layer, which is connected through a so-called wire bonding to a ground pad placed on an underlying substrate. However, this entails an increase in the thickness of the MEMS device, i.e., an increase in size along the so-called Z axis; furthermore, due to the shielding effect of the conductive layer, this solution is not feasible in the event that, for example, the MEMS device provides for the access of radiation inside the MEMS device.

According to other solutions, the electrical contact between the cap and the substrate is obtained through the formation of at least one vertical conductive path, so as not to incur an increase in the thickness of the MEMS device; however, this solution entails a considerable increase in the complexity of the manufacturing process.

BRIEF SUMMARY

The present disclosure is directed to provide a solution that overcomes at least in part the drawbacks as discussed above.

At least one embodiment of an electronic device of the present disclosure includes: a MEMS sensor device including a functional structure configured to transduce a chemical or physical quantity into a corresponding electrical quantity; a cap comprising a semiconductive substrate; and a bonding dielectric region, which mechanically couples the cap to the MEMS sensor device; and wherein the cap further comprises a conductive region, which extends between the semiconductive substrate and the MEMS sensor device and includes: a first portion, which is arranged laterally with respect to the semiconductive substrate and is exposed, so as to be electrically coupleable to a terminal at a reference potential by a corresponding wire bonding; and a second portion, which contacts the semiconductive substrate.

BRIEF DESCRIPTION OF THE SEVERAL VIEWS OF THE DRAWINGS

For a better understanding of the present disclosure, embodiments thereof are now described, purely by way of non-limiting example, with reference to the attached drawings, wherein.

DETAILED DESCRIPTION

Figure 1:
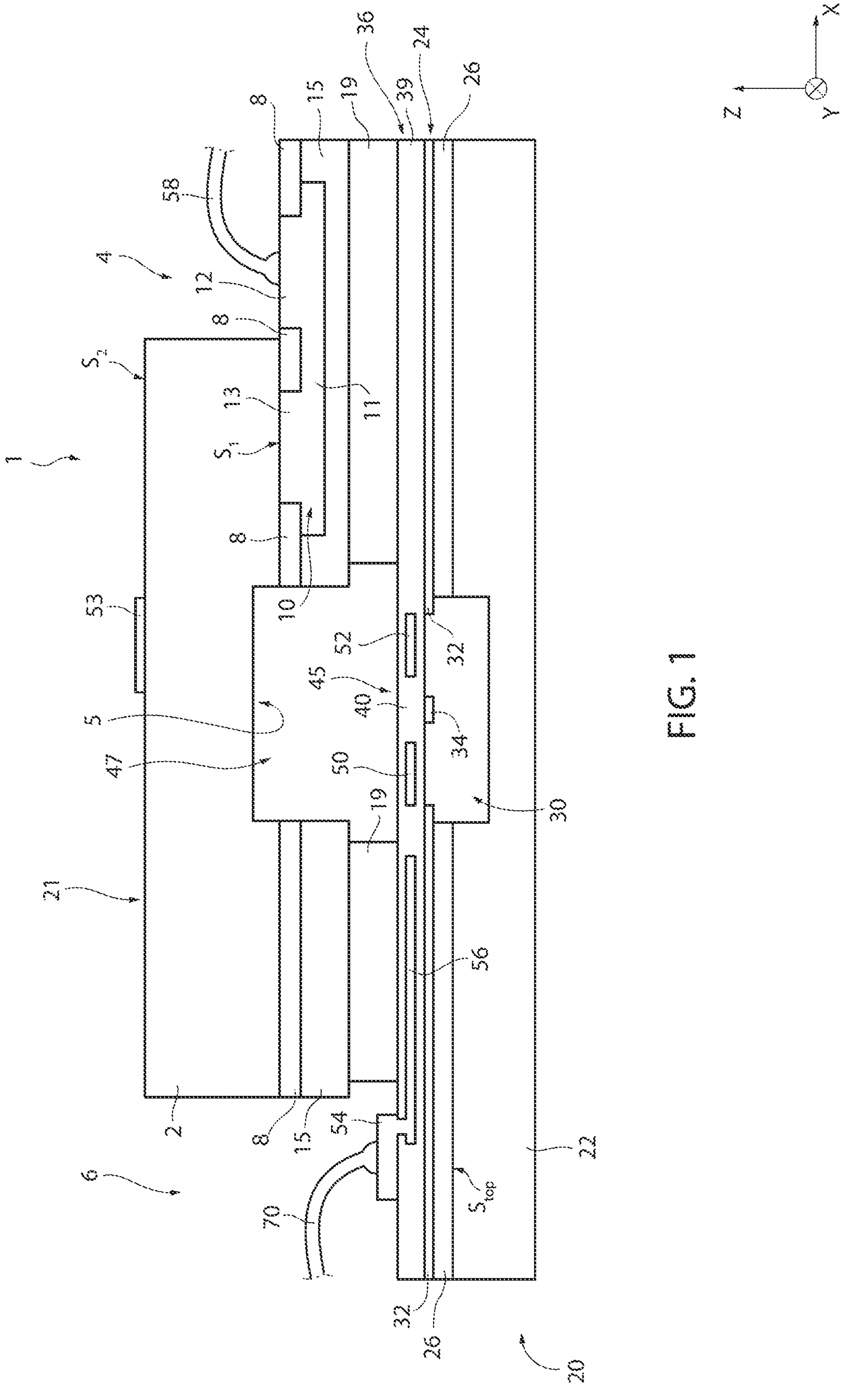
FIG. 1 schematically shows a cross-section of a MEMS device.

FIG. 1 shows a first embodiment of the present MEMS device. In particular, FIG. 1 shows a device 1, which forms a so-called TMOS ("Thermal-Metal-Oxide-Semiconductor") sensor, i.e., a sensor belonging to the category of micro-machined infrared sensors, which may include NMOS-SOI sensors. For this reason, hereinafter reference will be made to TMOS device 1.

In detail, the TMOS device 1 comprises a top substrate 2, of semiconductive or semiconductor material (e.g., silicon), which is delimited by a first and a second surface $S_1$, $S_2$, which are parallel to an XY plane of an XYZ orthogonal reference system. The first surface $S_1$ is arranged below the second surface $S_2$.

The top substrate 2 laterally delimits a first and a second recess 4, 6, which extend, without any loss of generality, on opposite sides of the top substrate 2. In some alternative embodiments, the first and second recesses 4, 6 are adjacent to each other and are on the same side of the top substrate 2 (see FIG. 18 of the present disclosure). Furthermore, the top substrate 2 forms a top cavity 5, which is laterally offset with respect to the first and the second recesses 4, 6 and extends upwards, from the first surface $S_1$. In particular, and without any loss of generality, along the X axis the top cavity 5 extends between the first and the second recesses 4, 6.

Below the first surface $S_1$ there extends a first dielectric region 8, which, although not shown, may be formed by one or more stacked insulating sub-regions, made for example of materials chosen from among: TEOS oxide, silicon nitride (SiN), silicon oxynitride (SiON). In particular, the first dielectric region 8 extends in direct contact with the overlying top substrate 2.

In greater detail, the first dielectric region 8 laterally delimits part of the top cavity 5 and furthermore extends laterally with respect to the overlying top substrate 2, so as to delimit the first recess 4 downwardly; in other words, part of the first dielectric region 8 faces the first recess 4.

The TMOS device 1 also comprises a conductive region 10, which is made, for example, of metal material (e.g., a material chosen from among: Al, AlCu, Cu, Au, Ti, TiW or a combination thereof) and extends in contact with the first dielectric region 8.

In particular, the conductive region 10 comprises a main portion 11, which extends below the first dielectric region 8, and a first and a second secondary portion 12, 13, which form a single piece with the main portion 11, are laterally offset from each other and traverse the first dielectric region 8, up to facing the first surface $S_1$. In practice, both the first and the second secondary portions 12, 13 extend between the first surface $S_1$ and the underlying main portion 11; furthermore, as clarified hereinafter, the first and the second secondary portions 12, 13 form corresponding contact regions.

In greater detail, the second secondary portion 13 of the conductive region 10 extends below the top substrate 2, wherewith it is in direct contact, while the first secondary portion 12 of the conductive region 10 is laterally offset with respect to the top substrate 2 and faces the first recess 4; in other words, the first recess 4 is delimited downwardly (e.g., at a lower end of the first recess 4) by the first secondary portion 12 of the conductive region 10, as well as by portions of the first dielectric region 8 adjacent to the first secondary portion 12 of the conductive region 10. The first secondary portion 12 of the conductive region 10 is therefore exposed.

In greater detail, and without any loss of generality, along the X axis the second secondary portion 13 of the conductive region 10 is interposed between the secondary portion 12 of the conductive region 10 and the top cavity 5.

The TMOS device 1 further comprises a second dielectric region 15 (optional), which extends below the first dielectric region 8 and the conductive region 10. In particular, although not shown, the second dielectric region 15 may be formed by one or more stacked insulating sub-regions, made for example of materials chosen from among: TEOS oxide, silicon nitride (SiN), silicon oxynitride (SiON).

The second dielectric region 15 contacts portions of the first dielectric region 8 which are laterally offset with respect to the conductive region 10, as well as the main portion 11 of the conductive region 10. Furthermore, the second dielectric region 15 laterally delimits part of the top cavity 5.

The TMOS device 1 also comprises a bonding layer 19, which is made for example of a glassy material (e.g., glass frit) and is arranged below the second dielectric region 15, wherewith it is in direct contact.

In greater detail, the bonding layer 19 laterally delimits part of the top cavity 5, which therefore extends through part of the top substrate 2, as well as through the first and the second dielectric regions 8, 15 and the bonding layer 19.

As regards the second recess 6, it is laterally delimited by a portion of the bonding layer 19 and by overlying portions of the top substrate 2 and of the first and the second dielectric regions 8, 15.

For practical purposes, the top substrate 2, the first and the second dielectric regions 8, 15 and the conductive region 10 form a cap 21.

The TMOS device 1 further comprises a sensor device 20, which is fixed to the cap 21 through the bonding layer 19, as described in greater detail below.

The sensor device 20 comprises a bottom substrate 22 and an intermediate substrate 24, both of semiconductive or semiconductor material (e.g., silicon), and having an intermediate bonding region 26 extending therebetween. In particular, the intermediate bonding region 26 is made for example of glassy material (e.g., glass-frit) and contacts the bottom substrate 22 and the intermediate substrate 24.

In greater detail, the bottom substrate 22 is delimited upwardly by a front surface $S_{top}$, parallel to the XY plane. Furthermore, the bottom substrate 22 laterally and downwardly delimits a bottom cavity 30, which extends in part below the front surface $S_{top}$.

The intermediate bonding region 26 extends on the front surface $S_{top}$. The bottom cavity 30 also extends through the intermediate bonding region 26; in practice, part of the bottom cavity 30 is laterally delimited by the intermediate bonding region 26.

The intermediate substrate 24 comprises a fixed portion 32, which contacts the underlying intermediate bonding region 26, and a respective suspended portion 34, which is suspended on the bottom cavity 30 and, although not shown, is fixed to the fixed portion 32.

The sensor device 20 further comprises a front region 36, which comprises a peripheral portion 39, which extends on the fixed portion 32 of the intermediate substrate 24, and an internal portion 40, which is suspended over the bottom cavity 30. Part of the internal portion 40 of the front region 36 overlies part of the suspended portion 34 of the intermediate substrate 24.

In greater detail, although not shown, the front region 36 is formed by respective sub-regions made for example of oxide, conductive and semiconductor material. Furthermore, in a per se known manner, the internal portion 40 of the front region 36 forms a detection or functional structure 45, described below. Part of the peripheral portion 39 of the front region 36 delimits the second recess 6 downwardly.

In still greater detail, and without any loss of generality, the top cavity 5 and the bottom cavity 30 are approximately vertically aligned. Furthermore, the mechanical coupling of the cap 21 to the sensor device 20 is such that the top cavity 5 and the bottom cavity 30 form a chamber 47, wherein the detection structure 45 extends. In practice, the detection structure 45 is interposed between the top cavity 5 and the bottom cavity 30; furthermore, without any loss of generality, the detection structure 45 is such that, although not visible in FIG. 1, there is communication between the top cavity 5 and the bottom cavity 30. Again without any loss of generality, the chamber 47 may be hermetic.

The detection structure 45 is of a per se known type; in particular, the detection structure 35 comprises, for example, a first and a second array 50, 52 of elements sensitive to temperature changes induced by infrared radiation; in particular, in the present example, the sensitive elements are formed by corresponding suspended MOSFET transistors (not shown) which operate below threshold. In practice, the detection structure 45 is an active region of suspended type.

Again without any loss of generality, the first and the second arrays 50, 52 are laterally offset from each other, as well as with respect to the suspended portion 34 of the intermediate substrate 24, which acts as a mechanical support. The first and the second arrays 50, 52 have therefore been previously released with respect to the intermediate substrate 24.

In addition, the TMOS device 1 comprises a shield or shield layer 53, which is formed by metal or conductive material and is arranged on the second surface $S_2$ of the top substrate 2 of the cap 21, so as to be approximately vertically aligned with the underlying second array 52. In this manner, the shield 53 shields the underlying second array 52, which acts as a reference, from the infrared radiation arriving from the outside; conversely, the first array 50 is laterally offset with respect to the shield 53, so as to be exposed to the infrared radiation, which impinges precisely on the first array 50 after having traversed the overlying portion of the top substrate 2.

In use, the first array 50 generates, in a per se known manner, electrical signals indicative of the intensity of the impinging infrared radiation, while the second array 52 generates electrical signals which may be used as a reference in a subsequent processing step of known type, for example to compensate for possible variations of the electrical signals generated by the first array 50 and caused by temperature variations independent of the infrared radiation, which therefore affect the first and the second arrays 50, 52 in the same manner.

In order to receive the electrical signals generated by the first and the second arrays 50, 52, the sensor device 20 comprises a plurality of pads 54 of conductive material (only one shown in FIG. 1) and a plurality of conductive paths 56 (only one shown in FIG. 1), also of conductive material, not necessarily equal to the conductive material of the pads. For example, the pads 54 and the conductive paths 56 may be of a metal material, such as for example a material chosen from among: Al, AlCu, Cu, Au, Ti, TiW or a combination thereof.

In greater detail, the pads 54 extend on the part of the peripheral portion 39 of the front region 36 which delimits the second recess 6 downwardly, therefore they face the second recess 6. Furthermore, in a per se known manner, the pads 54 are connected to corresponding sensitive elements of the first and the second arrays 50, 52, through corresponding conductive paths 56, so as to receive electrical signals generated by the sensitive elements. In FIG. 1, for simplicity of visualization, the connection between the conductive path 56 and the corresponding array is not visible. Furthermore, hereinafter it is assumed, for the sake of brevity, that only one pad 54 is present.

This having been said, a first wire bonding 58 extends between the first secondary portion 12 of the conductive region 10 and a reference potential region (not visible in FIG. 1), as explained hereinafter with reference to FIGS. 2A and 2B, wherein the TMOS device 1 is shown in a schematic and simplified manner.

Figure 2A:
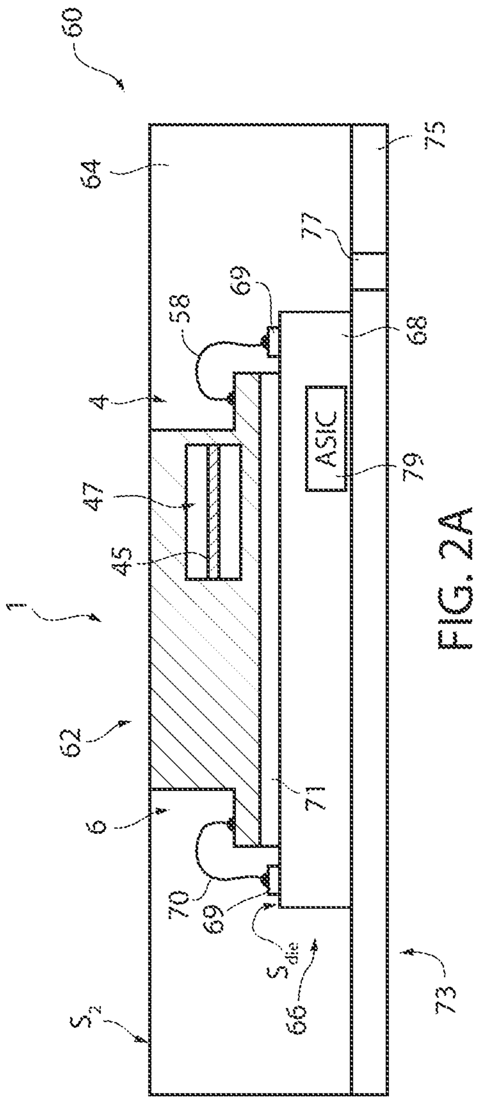
FIGS. 2A and 2B schematically show simplified cross-sections of packaged systems including the MEMS device shown in FIG. 1.
Figure 2B:
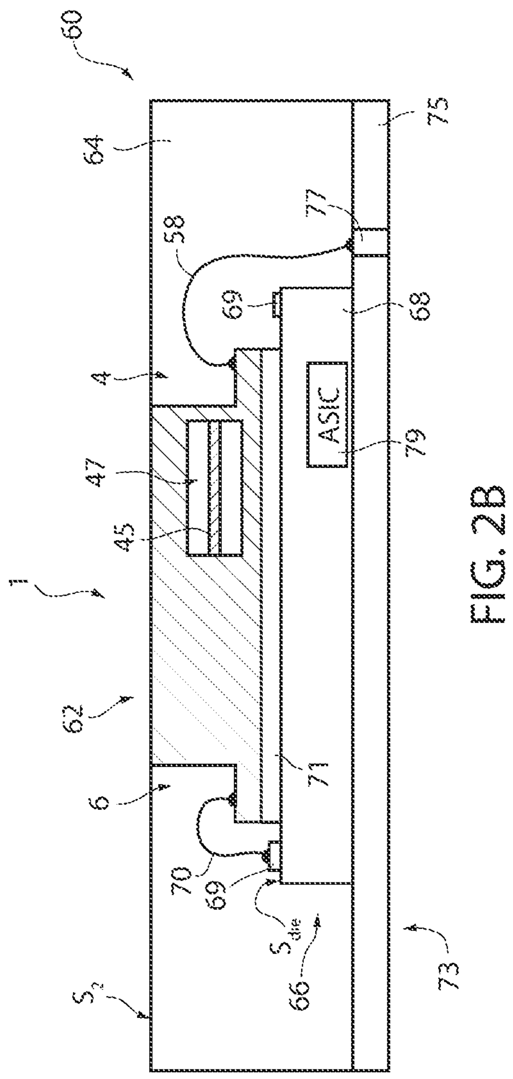

In detail, FIGS. 2A and 2B show a packaged system 60, which comprises an electronic system 62 and a package dielectric region 64, formed for example by a resin.

The electronic system 62 comprises the TMOS device 1 and a semiconductive or semiconductor die 66.

In a per se known manner, the semiconductive die 66 comprises a respective semiconductor body 68, wherein an ASIC circuit 79 is integrated, and is delimited by a respective top surface $S_{die}$. Although not shown, in a per se known manner the semiconductive die 66 may comprise further regions (e.g., dielectric regions and conductive regions) with respect to the semiconductor body 68. Furthermore, a plurality of conductive pads 69 (only two shown in FIGS. 2A and 2B) extend over the top surface $S_{die}$; hereinafter, the conductive pads 69 are referred to as the die pads 69.

The TMOS device 1 overlies the semiconductive die 66, whereto it is fixed, by interposing an adhesive region 71 (formed for example by polymeric material). The die pads 69 are laterally offset with respect to the adhesive region 71, so as to be exposed.

In addition, the packaged system 60 comprises a support structure 73, which comprises a planar region 75 of dielectric material, having the semiconductive die 66 fixed thereon, and a plurality of conductive pads 77 (only one shown in FIGS. 2A and 2B), which are referred to as the support pads 77; the support pads 77 are laterally offset with respect to the semiconductive die 66 and are electrically coupleable to the outside world.

This having been said, the first wire bonding 58 may connect the first secondary portion 12 of the conductive region 10 to a corresponding die pad 69 (as in the example shown in FIG. 2A), which in turn may contact the semiconductor body 68 of the semiconductive die 66, this semiconductor body 68 forming the ground of the electronic system 62.

Alternatively, as shown in FIG. 2B, the first wire bonding 58 may connect the first secondary portion 12 of the conductive region 10 to a corresponding support pad 77, which in turn is grounded in use.

In practice, the first wire bonding 58 allows the conductive region 10, and therefore also the top substrate 2 of the cap 21 to be grounded, owing to the contact present between the latter and the second secondary portion 13 of the conductive region 10. Furthermore, since the conductive region 10 extends below the top substrate 2 and the first secondary portion 12 of the conductive region 10 faces the first recess 4, the first wire bonding 58 extends from a reduced height (i.e., from the maximum height, along the Z axis, of the first secondary portion 12 of the conductive region 10), rather than from the second surface $S_2$ of the top substrate 2, and furthermore it may bend in the direction of the corresponding support pad 69 (or support pad 77) without first having to exceed the height of the second surface $S_2$ of the top substrate 2.

In practice, owing to the fact that the first secondary portion 12 of the conductive region 10 is arranged laterally with respect to the top substrate 2 and at a lower height with respect to the height of the second surface $S_2$, a reduction in the height extension of the first wire bonding 58 is obtained. Conversely, if for example the first secondary portion 12 faced a cavity passing through the top substrate 2, the first wire bonding 58 should in any case exceed the height of the second surface $S_2$ of the top substrate 2, before being able to bend in the direction of the corresponding support pad 69 (or support pad 77), with a consequent increase in thickness along the Z axis of the packaged system 60.

The present solution therefore allows reducing the thickness along the Z axis of the packaged device 60, while continuing to make use of the wire bonding technology, which is inexpensive and easy to implement.

In addition, as shown in FIG. 1 with reference to the only pad 54 visible, the TMOS device 1 comprises, for each pad 54, a corresponding second wire bonding 70, which connects the pad 54 to a corresponding die pad 69, as shown in FIGS. 2A-2B, in order to allow the transfer of the electrical signals generated by the sensitive elements of the first and the second arrays 50, 51 to the ASIC circuit 79, which is configured to process the received electrical signals. Although not shown, one or more of the conductive pads 69 may also be used to transfer one or more electrical signals generated by the ASIC circuit 79 to corresponding conductive pads 77.

Also in the case of the second wire bondings 70, the same considerations made with regard to the first wire bonding 58 apply as far as the reduced vertical extension is concerned. In fact, the second wire bondings 70 extend from the pads 54, which are arranged laterally with respect to the cap 21 and at a lower height with respect to the height of the second surface $S_2$, therefore they my bend in the direction of the corresponding die pads 69 without first having to exceed the height of the second surface $S_2$ of the top substrate 2.

Finally, FIGS. 2A and 2B show how the package dielectric region 64 extends over the support structure 73, incorporating the electronic system 62, surrounding it laterally. Without any loss of generality, the package dielectric region 64 leaves exposed the second surface $S_2$ of the top substrate 2 of the cap 21. Furthermore, the package dielectric region 64 extends into the first and the second recesses 4, 6 and incorporates the first wire bonding 58 and the second wire bondings 70.

Figure 3:
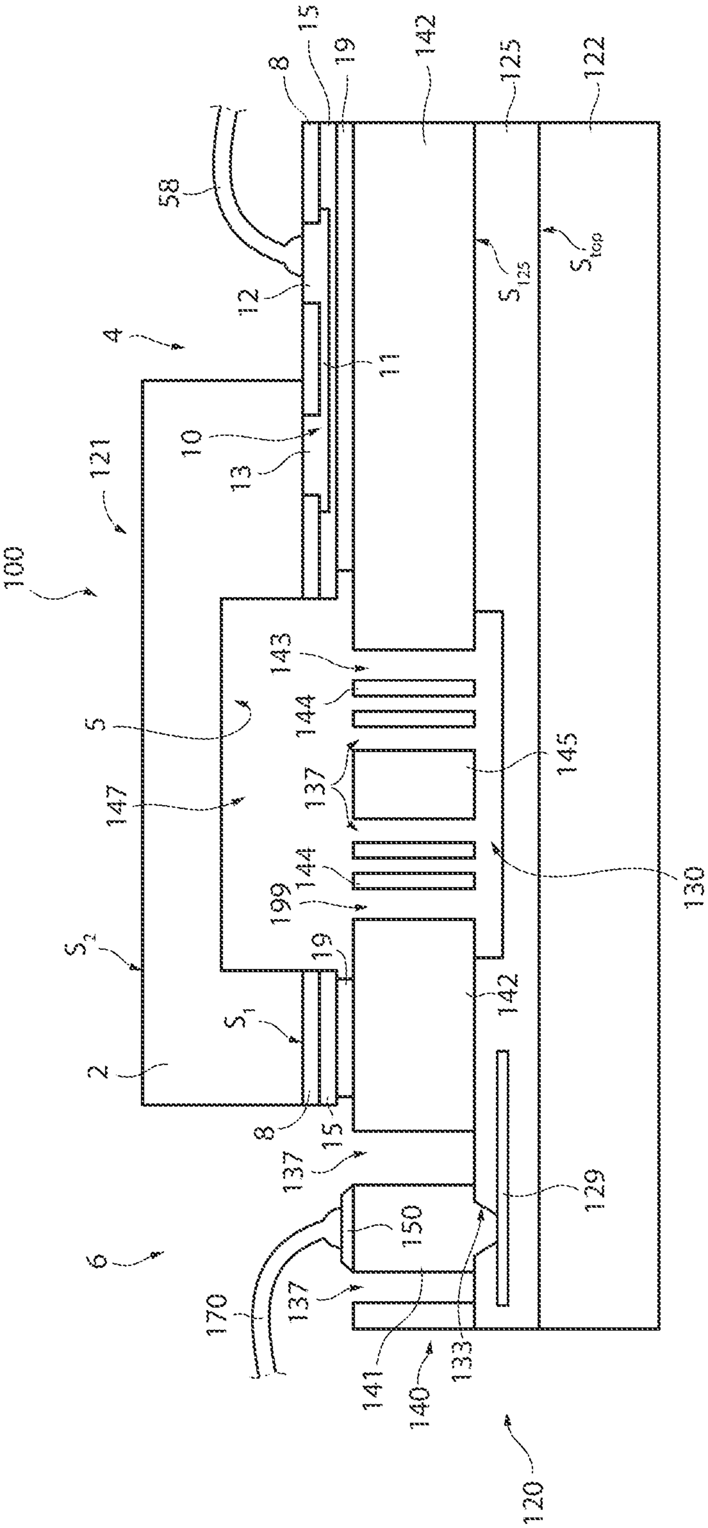
FIG. 3 schematically shows a cross-section of a further MEMS device.

FIG. 3 shows a different embodiment. In particular, FIG. 3 shows a MEMS device 100, which, purely by way of example, is an inertial sensor.

The MEMS device 100 comprises the cap, here indicated by 121 and described hereinafter limitedly to the differences with respect to what has been shown in FIG. 1. Elements already present in the cap 21 are indicated with the same reference signs.

In detail, the shield 53 is absent. The sensor device, here indicated by 120, is, as previously mentioned, an inertial sensor; for example, hereinafter it is assumed, purely by way of example, that the sensor device 120 is a MEMS accelerometer.

In greater detail, the sensor device 120 comprises the bottom substrate, here indicated by 122, which is still delimited upwardly by the front surface $S_{top}$.

Above the front surface $S_{top}$ there extends an insulating region 125 which, although not shown, may be formed by one or more stacked insulating sub-regions, made for example of materials chosen from among TEOS oxide (possibly, doped) and thermal oxide.

The insulating region 125 is delimited upwardly by a respective front surface $S_{125}$, parallel to the XY plane. Furthermore, conductive paths 129 (one visible in FIG. 3) extend inside the insulating region 125.

In addition, the sensor device 120 comprises the bottom cavity, here indicated by 130 and extending inside part of the insulating region 125, from the front surface $S_{125}$. Furthermore, the top cavity 5 is superimposed on the bottom cavity 130 so as to form the chamber, here indicated by 147.

The sensor device 120 further comprises one or more windows 133 (one visible in FIG. 3), each of which is laterally offset with respect to the bottom cavity 130 and extends through part of the insulating region 125, from the front surface $S_{125}$, up to facing an underlying corresponding conductive path 129.

The sensor device 120 further comprises a structural layer 140 of polycrystalline silicon, for example formed by deposition.

In detail, the structural layer 140 extends, in direct contact, on the insulating region 125, as well as inside the windows 133, so as to contact the conductive paths 129.

In greater detail, the structural layer 140 is traversed by a plurality of openings 137, each of which entirely traverses the structural layer 140 and faces the bottom cavity 130 or the insulating region 125 downwardly.

Again purely by way of example, the openings 137 laterally delimit: a plurality of portions 141 of the structural layer 140, referred to as the coupling portions 141 (one shown in FIG. 3), the bottom parts of the coupling portions 141 extending inside corresponding windows 133, so as to contact corresponding conductive paths 129; a portion 142 of the structural layer 140, referred to as the main portion 142, which contacts corresponding portions of the underlying insulating region 125; and a plurality of suspended portions 143, which are suspended above the bottom cavity 130 and form, for example, a movable mass 145 and a first and a pair of springs 144, each of which connects a respective end of the movable mass 145 to the main portion 142.

In greater detail, the springs 144 and the movable mass 145 extend between the top cavity 5 and the bottom cavity 130, inside the chamber 147. Furthermore, the openings 137 which delimit the springs 144 and the movable mass 145 put the top cavity 5 and the bottom cavity 130 in communication with each other. In practice, the main portion 142 of the functional layer 140 laterally delimits a volume 199, which faces, on one side, the top cavity 5 and, on the other side, the bottom cavity 130; the springs 144 and the movable mass 145 extend into the volume 199.

The springs 144 are deformable so as to allow the movable mass 145 to translate parallel to the X axis, as a function of the acceleration whereto the sensor device 120 is subject. In this regard, the sensor device 120 may for example be a MEMS accelerometer with detection of capacitive type, i.e., it is assumed that the variations of position of the movable mass 145 induced by the acceleration to be measured are transduced into corresponding capacitance variations of a detection capacitor (not shown). Furthermore, again by way of example, it is assumed that one or more of the conductive paths 129 are electrically connected to the detection capacitor, so as to receive electrical signals indicative of the aforementioned capacitance variations and, therefore, of the acceleration value to be measured.

In greater detail, each coupling portion 141 has, for example, an approximately cylindrical (or prismatic) shape and is separated from the main portion 142. Furthermore, the coupling portions 141 face the second recess 6 upwardly, therefore they are laterally offset with respect to the cap 121.

On each coupling portion 141 there extends a corresponding pad 150 of conductive material (e.g., a material chosen from among: Al, AlCu, Cu, Au, Ti and TiW or a combination thereof), which hereinafter is referred to as the connection pad 150. In FIG. 3 only one connection pad 150 is visible.

Although not shown in FIG. 3, each connection pad 150 is connected through a corresponding second wire bonding (here indicated by 170) to a corresponding die pad 69 of the semiconductive die 66, in the same manner described with reference to FIGS. 1 and 2A-2B, so as to allow the ASIC circuit 79 to receive the aforementioned electrical signals indicative of the acceleration value to be measured.

As regards the first wire bonding 58, although not further shown, it connects the second secondary portion 12 of the conductive region 10 alternatively to a corresponding die pad 69 or to a corresponding support pad 77, as already described with reference to FIGS. 2A and 2B.

In practice, the first wire bonding 58 has the same arrangement, with respect to the cap 121, described with reference to the embodiment shown in FIG. 1; furthermore, again with respect to the cap 121, the connection pads 150 have substantially the same arrangement as the pads 54 shown in FIG. 1. Consequently, also the embodiment shown in FIG. 3 allows obtaining the same advantages described with reference to the embodiment shown in FIG. 1. The embodiment shown in FIG. 3 therefore differs from the embodiment shown in FIG. 1 by the presence, in the chamber 147, of a functional structure (formed by the springs 144 and by the movable mass 145) for transducing a dynamic quantity (the acceleration) into one or more electrical signals, in lieu of the detection structure 45.

The manufacturing process of the TMOS device 1 is described hereinafter.

Figure 4:
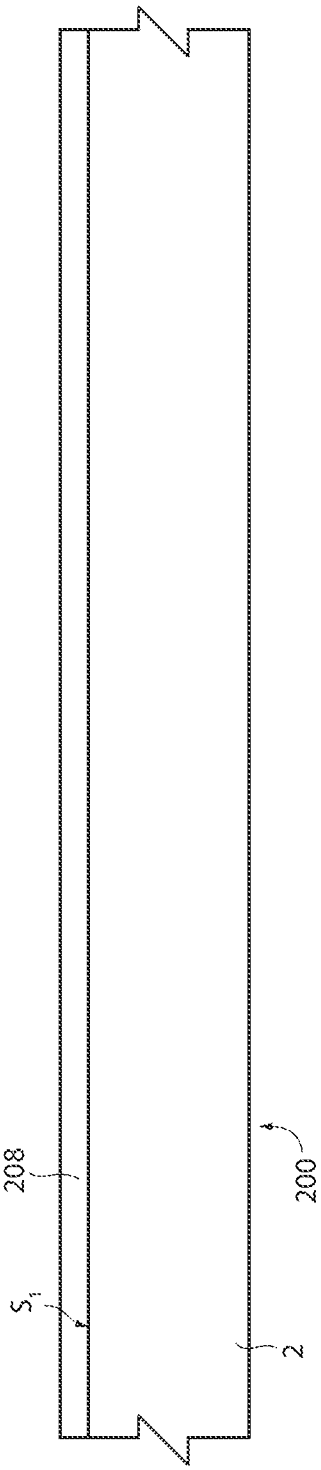
FIGS. 4-15 schematically show sections of the MEMS device shown in FIG. 1, during corresponding steps of a manufacturing process.

In detail, as shown in FIG. 4, a first semiconductive wafer 200 is initially provided, which comprises the top substrate 2 and a first layered dielectric region 208, intended to form the first dielectric region 8.

Figure 5:
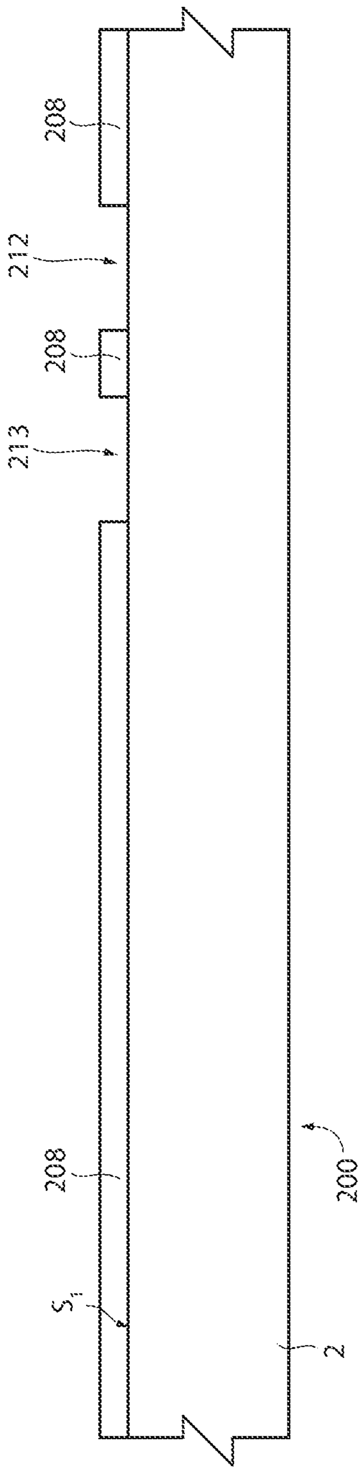

Then, as shown in FIG. 5, two portions of the first layered dielectric region 208 are selectively removed, so as to form respectively a first and a second process window 212, 213, which face the top substrate 2.

Figure 6:
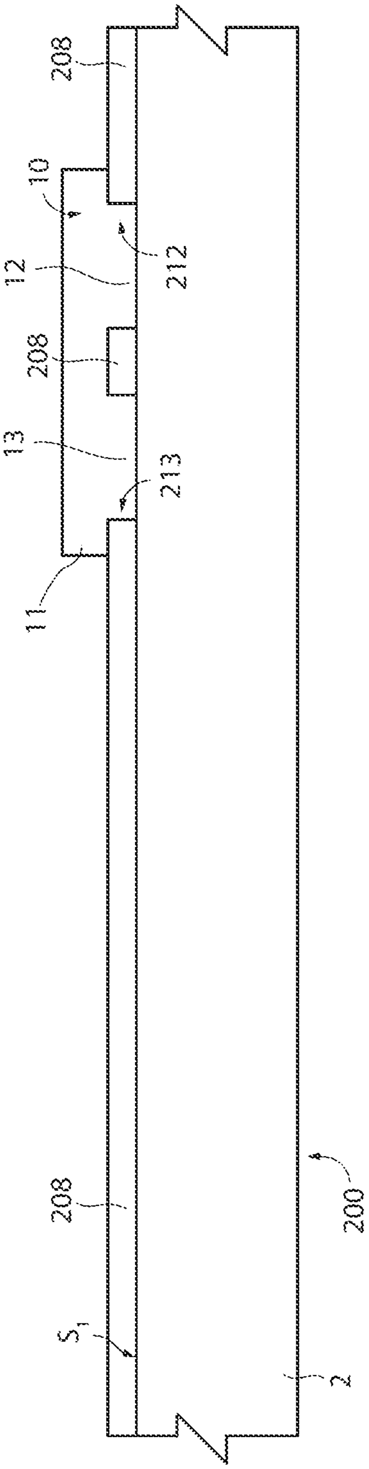

Subsequently, as shown in FIG. 6, the conductive region 10 is formed, so that the first and the second secondary portions 12, 13 extend respectively inside the first and the second process windows 212, 213 and the main portion 11 overlies the first and the second secondary portions 12, 13.

Although not shown in detail, the conductive region 10 may be formed by depositing a metal layer on the first layered dielectric region 208 and inside the first and the second process windows 212, 213 and subsequently selectively removing portions of the metal layer.

Figure 7:
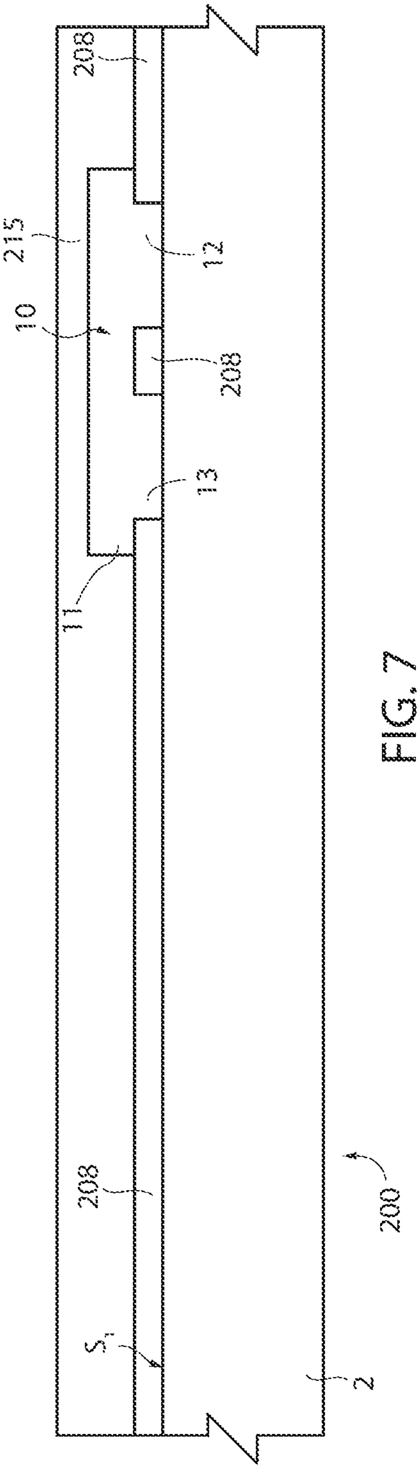

Then, as shown in FIG. 7, a second layered dielectric region 215 is formed, on the conductive region 10 and on the exposed portions of the first layered dielectric region 208, the second layered dielectric region 215 being intended to form the second dielectric region 15 (optional).

Figure 8:
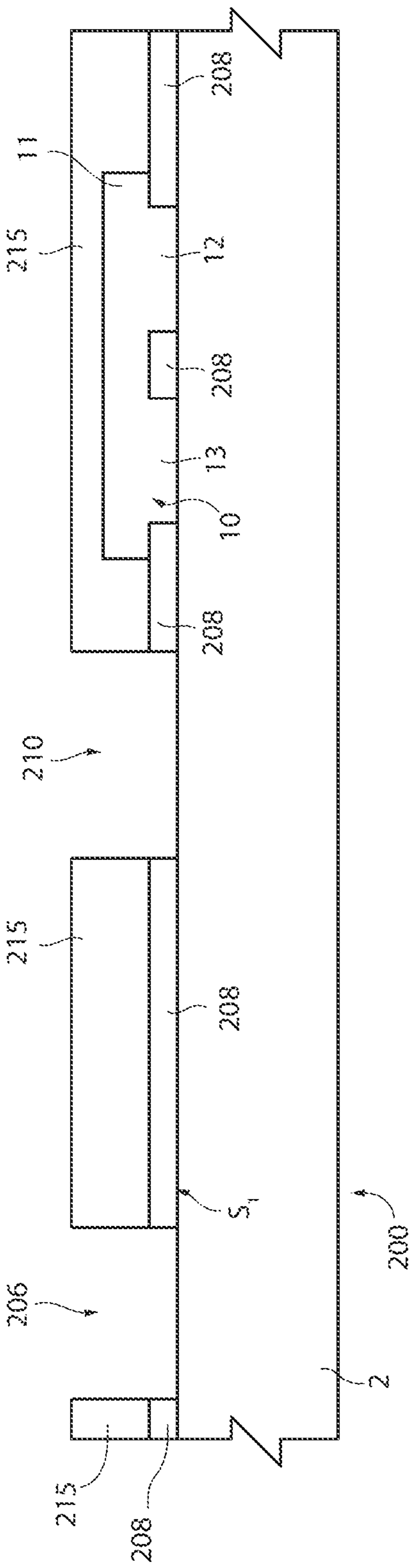

Subsequently, as shown in FIG. 8, portions of the second layered dielectric region 215 and underlying portions of the first layered dielectric region 208 are selectively removed, so as to form a first and a second opening 206, 210, which are laterally offset with respect to the conductive region 10. In particular, each of the first and the second process openings 206, 210 faces a corresponding portion of the first surface $S_1$ of the top substrate 2.

Figure 9:
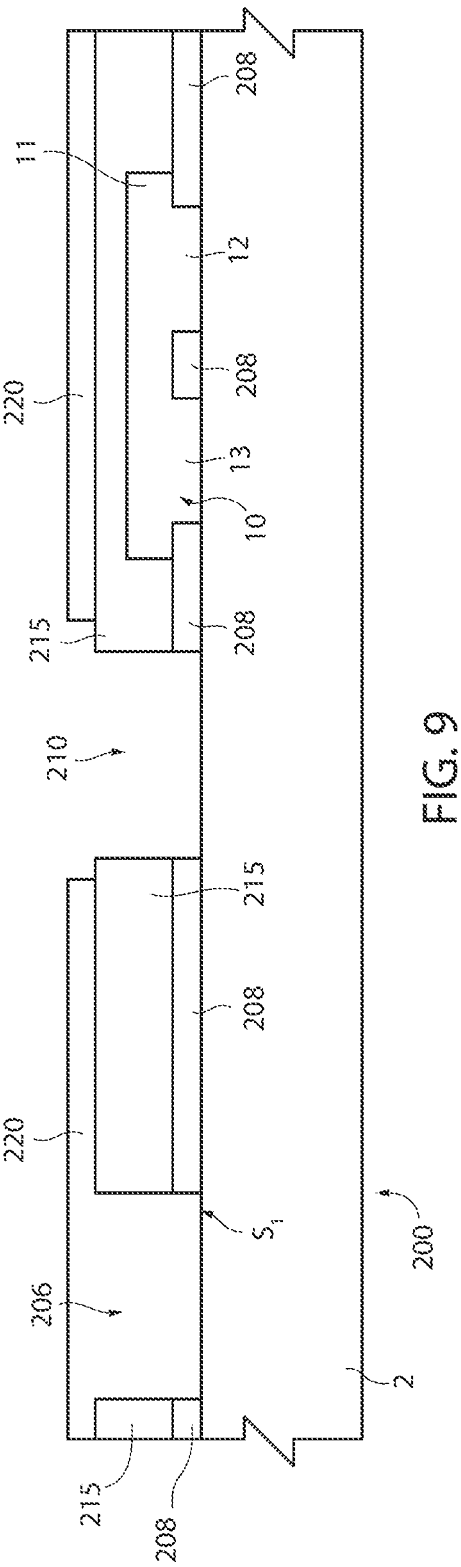

Then, as shown in FIG. 9, a protective layer 220 is formed, which is made for example of resist and extends on the second layered dielectric region 215 and inside the first process opening 206. The protective layer 220 leaves exposed portions of the first and the second layered dielectric regions 208, 215 which delimit the second process opening 210, therefore it does not extend inside the second process opening 210 and leaves exposed the portion of the first surface $S_1$ which forms the bottom of the second process opening 210.

Figure 10:
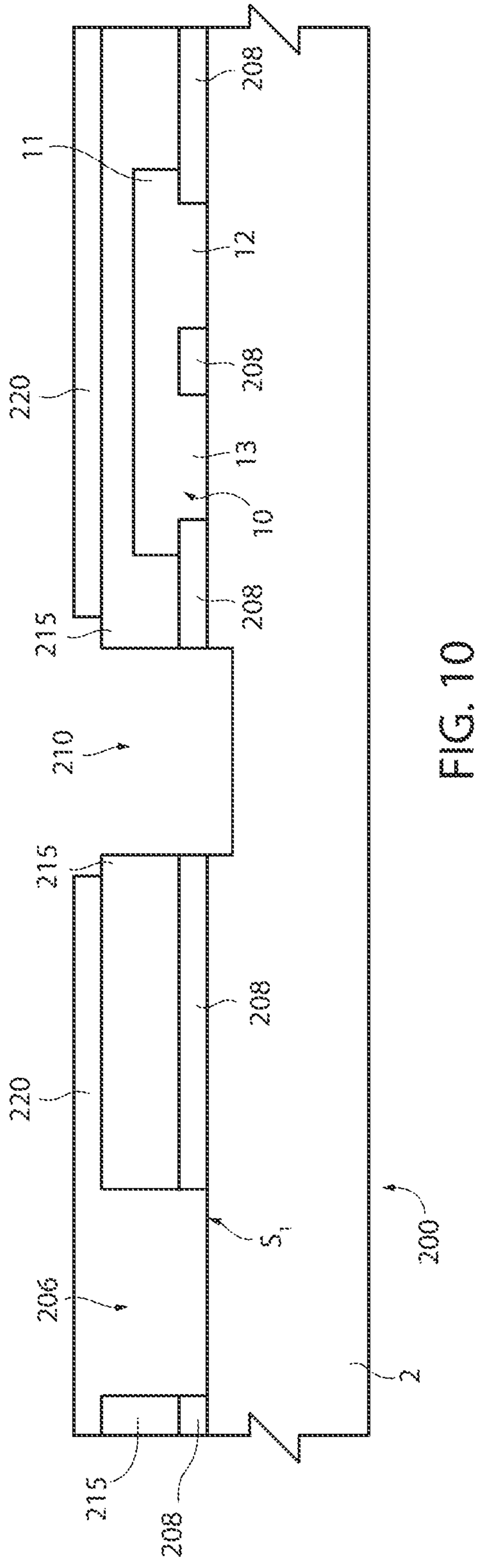

Subsequently, as shown in FIG. 10, a selective removal (e.g., by dry etching) of a portion of the top substrate 2 is performed, from the portion exposed by the first surface $S_1$ which forms the bottom of the second process opening 210; in this manner, the second process opening 210 partially penetrates the top substrate 210. The protective layer 220 instead protects the portion of the top substrate 2 which forms the bottom of the first process opening 206.

Figure 11:
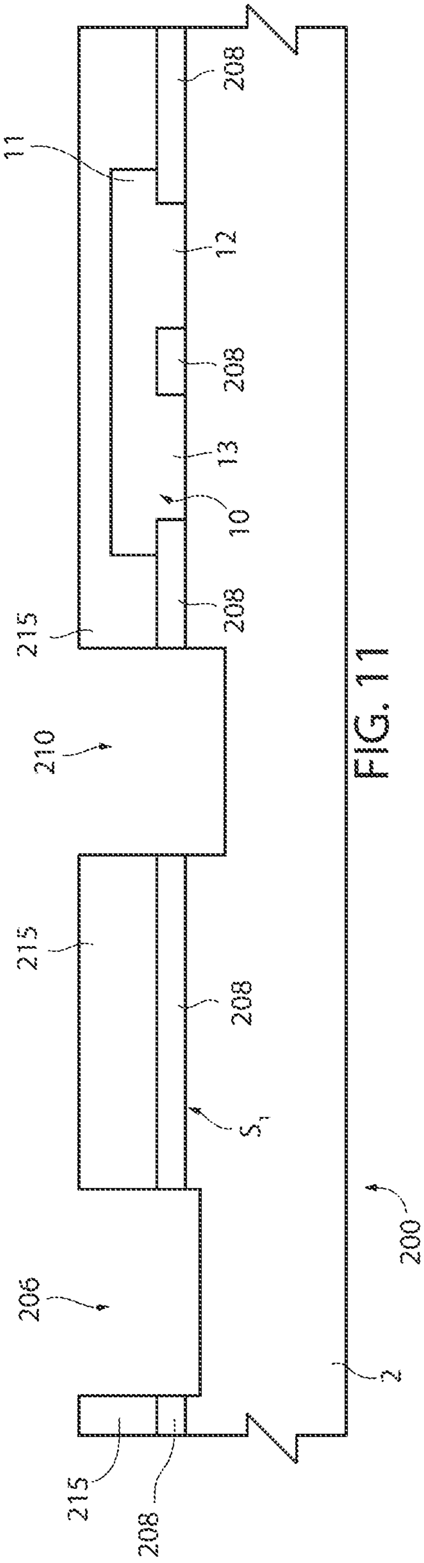

Subsequently, the protective layer 220 is removed. Furthermore, as shown in FIG. 11, there may be performed a selective removal (e.g., by dry etching masked by the first and the second layered dielectric regions 208, 215) of a portion of the top substrate 2 which forms the bottom of the first process opening 206, as well as of a further portion of the top substrate 2, which forms the bottom of the second process opening 210.

Figure 12:
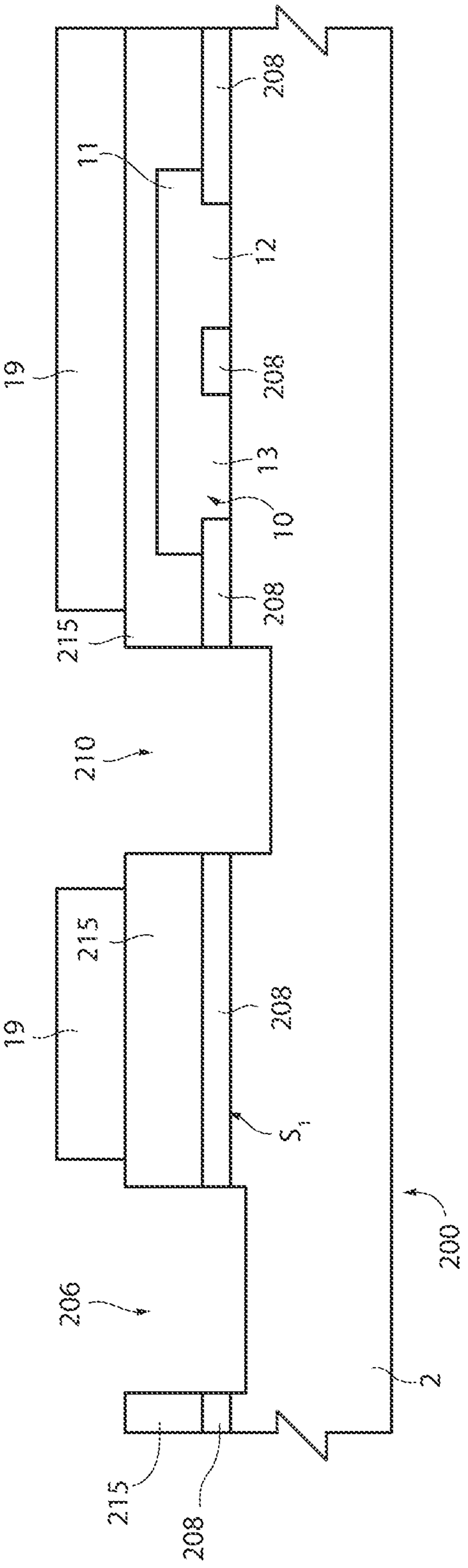

Subsequently, as shown in FIG. 12, the bonding layer 19 is formed, for example by molding glassy material. The bonding layer 19 is laterally offset with respect to the first and the second process openings 206, 210.

Figure 13:
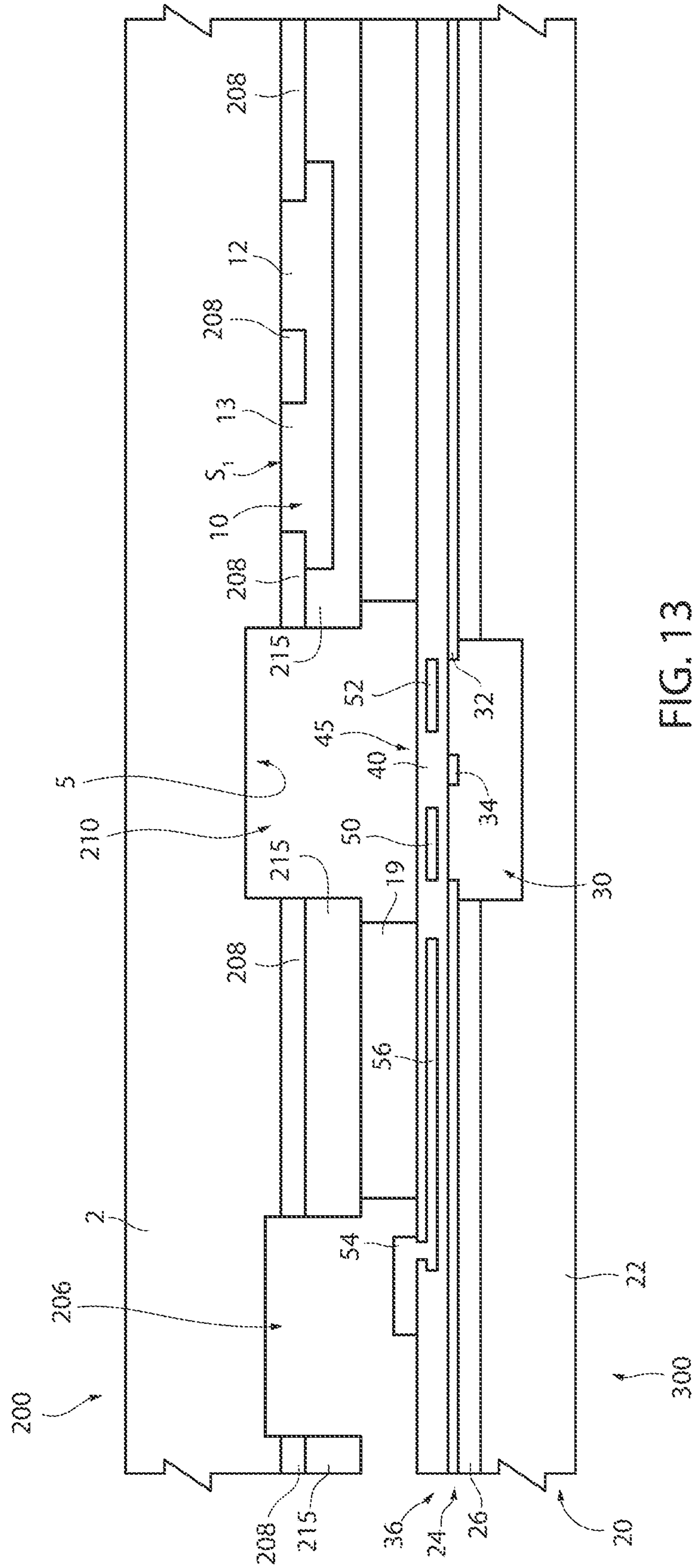

Then, as shown in FIG. 13, the first semiconductive wafer 200 is flipped over and is coupled to a second semiconductive wafer 300, wherein the sensor device 20 has previously been formed, in a per se known manner. In particular, the coupling occurs so that the bonding layer 19 contacts the front region 36 of the sensor device 20, as previously explained, as well as so that the pads 54 are arranged below the first process opening 206 and the detection structure 45 is arranged below the second process opening 210. In practice, the second process opening 210 faces the detection structure 45 and forms the top part of the top cavity 5, the bottom part of the top cavity 5 being laterally delimited by portions of the bonding layer 19.

Then, although not shown and optionally, the top substrate 2 may be mechanically polished from the back, to reduce its thickness. At the end of this operation, the top substrate 2 is delimited upwardly by the second surface $S_2$.

Figure 14:
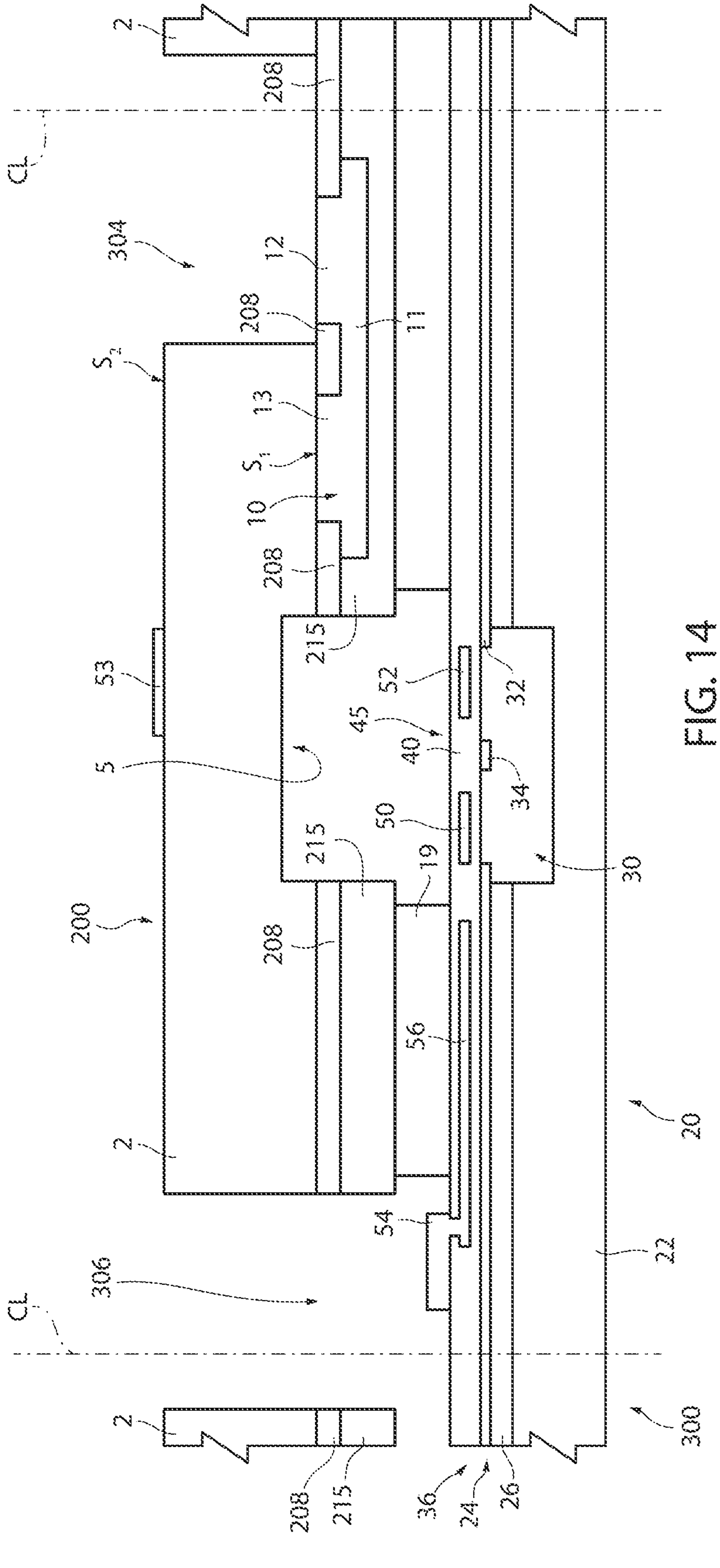

Subsequently, as shown in FIG. 14, the shield 53 is formed and then there are selectively removed: a portion of the top substrate 2 which overlies the first process opening 206, so as to form a through cavity 306, which traverses the top substrate 2 and the first and the second layered dielectric regions 208, 215, which faces the underlying pads 54; and a portion of the top substrate 2 overlying the first secondary portion 12 of the conductive region 10, so as to expose the first secondary portion 12 of the conductive region 10 and form a preliminary cavity 304. The preliminary cavity 304 traverses the top substrate 2 and faces the first secondary portion 12 of the conductive region 10 and adjacent portions of the first layered dielectric region 20 and is laterally offset with respect to the second secondary portion 13 of the conductive region 10.

Then, singulation operations of the TMOS device 1 (shown in FIG. 15) are performed from the group formed by the first and the second semiconductive wafers 200, 300. In practice, dicing operations of the group formed by the first and the second semiconductive wafers 200, 300 are performed, along cutting lines CL, shown in FIG. 14.

In particular, the cutting lines CL traverse the preliminary cavity 304 and the through cavity 306, in such a way that, at the end of the dicing, the residual portions of the preliminary cavity 304 and of the through cavity 306 respectively form the first and the second recesses 4, 6. The residual portions of the first and the second layered dielectric regions 208, 215 form respectively the first and the second dielectric regions 8, 15.

Then, although not further shown, the TMOS device 1 is coupled to the semiconductive die 66 which forms the ASIC circuit 79, in a per se known manner. Subsequently, in a per se known manner, the first wire bonding 58 and the second wire bondings 70 are formed.

The manufacturing process of the MEMS device 100 is of the same type described with reference to the TMOS device 1. In particular, the operations described with reference to FIGS. 4-12 may be performed.

Figure 16:
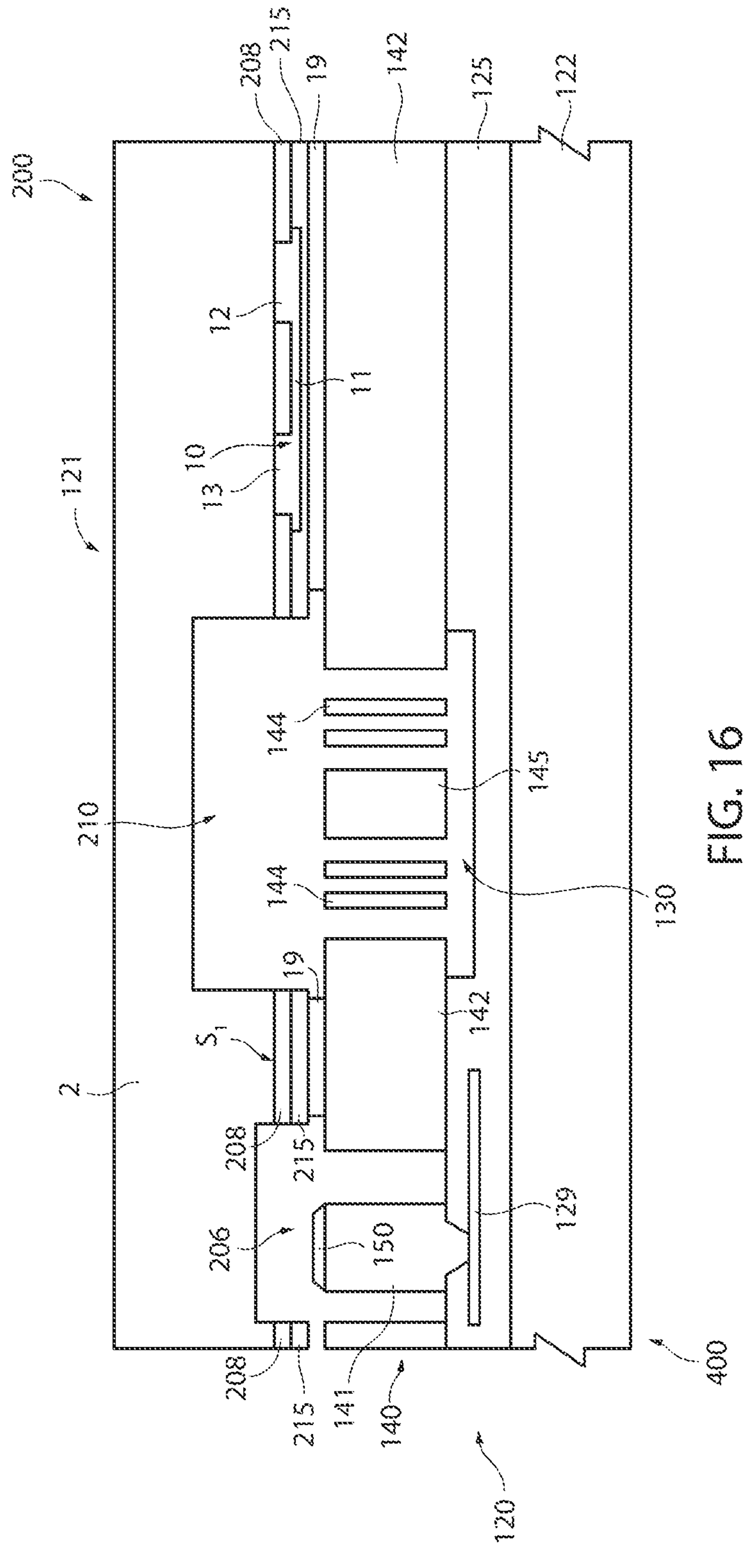
FIGS. 16-17 schematically show sections of the MEMS device shown in FIG. 3, during corresponding steps of a manufacturing process.

Then, as shown in FIG. 16, the first semiconductive wafer 200 is flipped over and is coupled to a second semiconductive wafer, here indicated by 400, wherein the sensor device 120 has previously been formed, in a per se known manner. In particular, the coupling is such that the connection pads 150 are arranged below the first process opening 206 and the springs 44 and the movable mass 145 are arranged below the second process opening 210.

Figure 15:
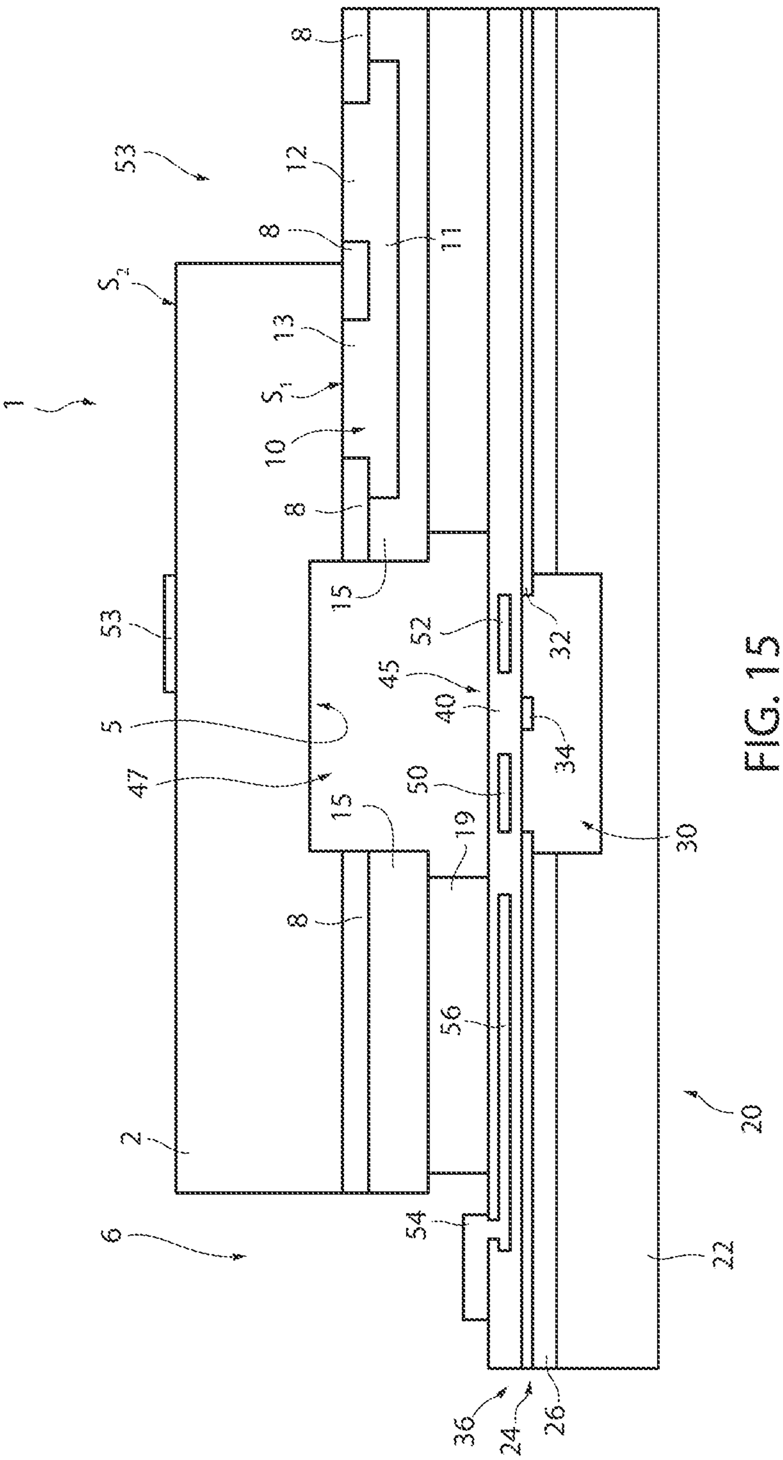
Figure 17:
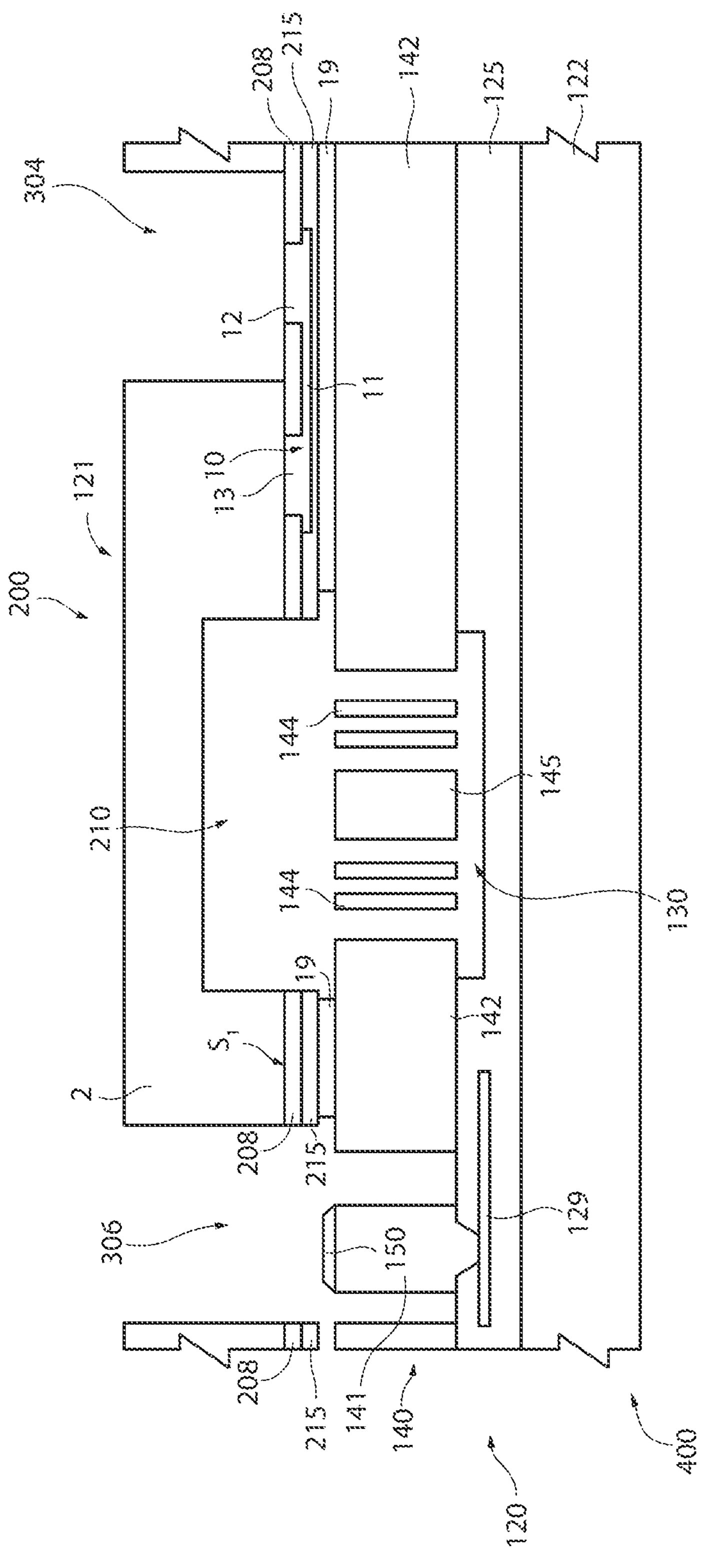

Subsequently, the manufacturing process continues in the same manner described with reference to the manufacturing of the TMOS device, therefore in the same manner described with reference to FIGS. 14 and 15, except for the formation of the shield 53. Purely by way of example, FIG. 17 shows the group formed by the first and the second semiconductive wafers 200, 400, after performing the operations for forming the through cavity 306 and the preliminary cavity 304, and before performing the singulation operations.

Also in the case of the MEMS device 100, the first wire bonding 58 and the second wire bondings 170 are formed after the MEMS device 100 has been singulated and coupled to the semiconductive die 66 which forms the ASIC circuit 79.

The advantages that the present solution affords are clear from the previous description.

In particular, the present MEMS device provides for a non-conductive bonding between the sensor device and the cap, whose semiconductive substrate may be grounded during the back-end operations (therefore, without having to provide preceding conductive vias), providing protection against electric discharges.

Finally, it is clear that modifications and variations may be made to the transducer device and the manufacturing process described and illustrated herein without thereby departing from the scope of the present disclosure, as defined in the attached claims.

For example, the bonding layer 19 and/or the intermediate bonding region 26 may be formed by an insulating material other than glass frit, such as for example organic material such as a so-called dry film or an epoxy glue or polymeric material.

As previously mentioned with reference to FIG. 1, the second dielectric region 15 is optional and therefore may be absent. In this case, the bonding layer 19 may contact, as well as the first dielectric region 8, also the conductive region 10.

The sensor device may be different from what has been described and therefore may be configured to transduce into at least one electrical signal a different quantity with respect to what has been described, such as for example an angular speed or a radiation other than infrared.

For example, embodiments of the type shown in FIG. 1 are possible, but wherein the sensor device is configured to transduce a different physical or chemical quantity. For example, the detection structure 45 may comprise a membrane (not shown) configured to vary its resistance as a function of the amount of a chemical species (e.g., carbon monoxide, sulfur dioxide or zinc oxide) present in the chamber 47, which is not hermetic.

The top cavity 5 may have a more limited thickness with respect to what has been described, and in particular may extend from the first surface $S_1$, rather than partially penetrate the top substrate 2.

Furthermore, the protective layer 220 may be omitted, in which case the operations referred to in FIG. 10 also entail the removal of the aforementioned portion of the top substrate 2 which forms the bottom of the first process opening 206. Consequently, at the end of the operations referred to in FIG. 10, the first and the second process openings 206, 210 have a same depth; furthermore, the operations referred to in FIG. 11 are not performed.

Figure 18:
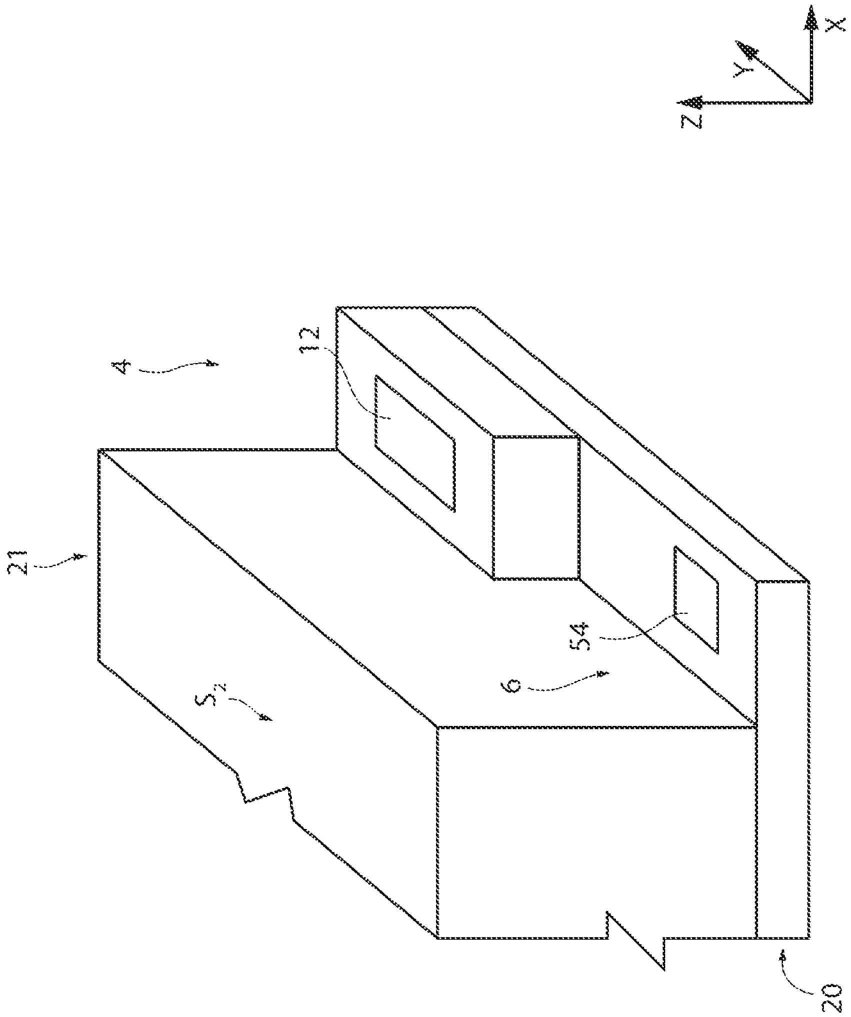
FIG. 18 shows a simplified perspective view with portions removed of a part of a MEMS device.

Variations are also possible wherein the first and the second recesses 4, 6 are arranged on a same side of the top substrate 2. In other words, as qualitatively shown in FIG. 18 with reference, by way of example, to the embodiment shown in FIG. 1 and to a single pad 54, the second secondary portion 12 of the conductive region 10 and the pad 54 may be placed on a same side of the top substrate 2, in which case they are offset along the Y axis, are still arranged at different heights and are for example aligned parallel to the X axis; in practice, the first and the second recesses 4, 6 communicate with each other and form a single recess. For the sake of simplicity, in FIG. 18 the first and the second wire bondings 58, 70 are not shown; furthermore, FIG. 18 shows in a simplified manner the cap 21 and the sensor device 20, without showing the relative regions in detail.

Figure 19:
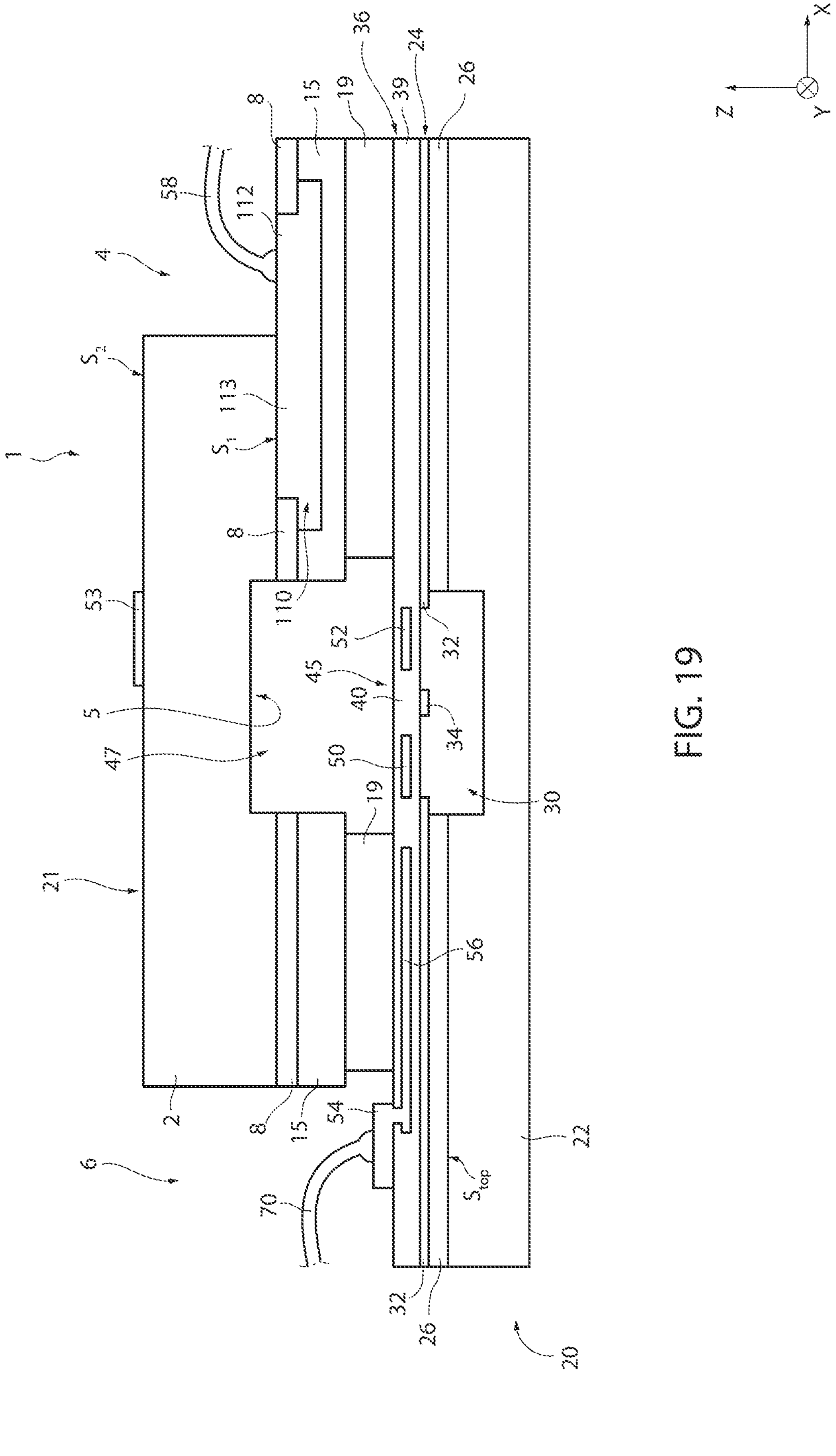
FIG. 19 schematically shows a cross-section of a variant of the MEMS device shown in FIG. 1.

In general, the conductive region may also be of the type shown in FIG. 19. In particular, the conductive region, here indicated by 110, has an approximately planar shape and extends below the first surface $S_1$. A first part 112 of the conductive region 110 is laterally offset with respect to the top substrate 2, so as to face the first recess 4; a second part 113 of the conductive region 110 is arranged to the side of the first part 112 and contacts an overlying portion of the top substrate 2. The first wire bonding 58 contacts the first part 112 of the conductive region 110. The corresponding manufacturing process provides, with reference to the operations shown in FIG. 5, for the formation of a single process window, rather than the first and a second process window 212, 213.

Regarding the manufacturing process, it is possible that, after performing the operations shown with reference to FIG. 5, and therefore after forming the first and the second process windows 212, 213, an ion implantation process is performed in the portions of top substrate 2 facing the second process window 213, so as to reduce the contact resistance between the semiconductor of the top substrate 2 and the conductive region 10. In fact, in this manner the second secondary region 13 of the conductive region 10 contacts an enriched portion of the top substrate 2. Alternatively, the ion implantation may occur before the formation of the first layered dielectric region 208.

Finally, the sequence of operations of the manufacturing process may differ from what has been described.

An electronic device may be summarized as including a MEMS sensor device (20;120) including a functional structure (45;144,145) configured to transduce a chemical or physical quantity into a corresponding electrical quantity; a cap (21) including a semiconductive substrate (2); and a bonding dielectric region (19), which mechanically couples the cap (21) to the MEMS sensor device (20; 120); and wherein the cap (21) further includes a conductive region (10;110), which extends between the semiconductive substrate (2) and the MEMS sensor device (20;120) and includes a first portion (12;112), which is arranged laterally with respect to the semiconductive substrate (2) and is exposed, so as to be electrically coupleable to a terminal at a reference potential (69,77) by a corresponding wire bonding (58); and a second portion (13;113), which contacts the semiconductive substrate (2).

The cap (21) may form a recess (4) laterally delimited by the semiconductive substrate (2); and the first portion (12; 112) of the conductive region (10;110) may face the recess (4) upwardly.

The MEMS sensor device (20;120) may include at least one respective pad (54; 150), which is arranged laterally with respect to the overlying cap (21), is electrically coupled to the functional structure (45;144,145) and is exposed.

The cap (21) may delimit a top cavity (5) which faces the functional structure (45;144,145) of the MEMS sensor device (20;120).

The MEMS sensor device (2;120) may delimit a bottom cavity (30); and the functional structure (45;144,145) may be suspended between the bottom cavity (30) and the top cavity (5).

The functional structure (45) may include at least one array sensor (50) sensitive to the radiation or a movable mass (145).

An electronic system may be summarized as including the electronic device (1;100) and a semiconductive die (66) wherein an electronic circuit (79) is formed, the semiconductive die (66) including a respective semiconductor body (68) and a respective first pad (69) electrically connected to the semiconductor body (66), the MEMS sensor device (20;120) being fixed to the semiconductive die (66); said electronic system (60) further including a first wire bonding (58) which electrically connects the first portion (12;112) of the conductive region (10;110) and the first pad (69) of the semiconductive die (66).

The electronic system may include the electronic device (1;100); a semiconductive die (66) wherein an electronic circuit (79) is formed, the MEMS sensor device (20;120) being fixed to the semiconductive die (66); and a support (73) which carries the semiconductive die (66) and may include a respective pad (77) electrically coupleable to the outside world; said electronic system (60) may further include a first wire bonding (58) which connects the first portion (12;112) of the conductive region (10;110) and the pad (77) of the support (73).

The semiconductive die (66) may include a respective second pad (69) electrically connected to the electronic circuit (79), said electronic system (60) may further include a second wire bonding (70) which connects the pad (54;150) of the MEMS sensor device (20;120) to said second pad (69) of the semiconductive die (66).

A process for manufacturing an electronic device (1;100) may be summarized as including forming a cap (21) including a semiconductive substrate (2); forming a bonding dielectric region (19) which mechanically couples the cap (21) to a MEMS sensor device (20;120) including a functional structure (45;144,145) configured to transduce a chemical or physical quantity into a corresponding electrical quantity; and wherein forming the cap (21) includes forming a conductive region (10;110) which extends between the semiconductive substrate (2) and the MEMS sensor device (20;120) and includes a first portion (12; 112), which is arranged laterally with respect to the semiconductive substrate (2) and is exposed, so as to be electrically coupleable to a terminal at a reference potential (69,77) by a corresponding wire bonding (58); and a second portion (13;113), which contacts the semiconductive substrate (2).

Forming a cap (21) may include providing a first semiconductive wafer (200) including the semiconductive substrate (2); forming a dielectric structure (208,215) on the first semiconductive wafer (200); forming the conductive region (10) so that it traverses the dielectric structure (208,215) and contacts the semiconductive substrate (2); forming the bonding dielectric region (19) on the dielectric structure (208, 215) and subsequently mechanically coupling, through the bonding dielectric region (19), the first semiconductive wafer (200) to a second semiconductive wafer (300) including the MEMS sensor device (20;120), so as to form a group (200,300) wherein the semiconductive substrate (2) overlies the dielectric structure (208,215), which overlies the bonding dielectric region (19), which overlies the MEMS sensor device (20;120); and subsequently selectively removing a portion of the semiconductive substrate (2) that overlies the first portion (12;112) of the conductive region (10;110), so as to form a preliminary cavity (304) which traverses the semiconductive substrate (2) and exposes the first portion (12;112) of the conductive region (10;110); and subsequently performing a singulation of said group (200;300), said singulation may include performing dicing of the group (200,300) along a cutting line (CL) that traverses the preliminary cavity (304), so that a residual portion of the preliminary cavity (304) forms a first recess (4) of the cap (21), the first portion (12;112) of the conductive region (10;110) facing said first recess (4) upwardly.

The manufacturing process may further include, before forming the bonding dielectric region (19), forming an opening (206) through the dielectric structure (208,215); and the MEMS sensor device (20;120) may include at least one respective pad (54; 150), which, after mechanically coupling the first and the second semiconductive wafers (200,300), faces the opening (206); said process may further include, after mechanically coupling the first and the second semiconductive wafers (200,300), selectively removing a portion of the semiconductive substrate (2) that overlies the opening (206), so as to form a through cavity (306) that traverses the semiconductive substrate (2), the dielectric structure (208, 215) and the bonding dielectric region (19) and faces the pad (54) of the MEMS sensor device (20; 120); and wherein the singulation of said group (200;300) may further include performing dicing of the group (200,300) along a cutting line (CL) that traverses the through cavity (306), so that a residual portion of the through cavity (306) forms a second recess (6) of the electronic device (1;100), said second recess (6) being delimited downwardly by the MEMS sensor device (20;120), the pad (54) of the MEMS sensor device (20;120) facing said second recess (6) upwardly.

A process for manufacturing an electronic system may be summarized as including performing the manufacturing process of the electronic device (1;100) according to any of claims 10 to 12; fixing the MEMS sensor device (20; 120) to a semiconductive die (66) wherein an electronic circuit (79) is formed, the semiconductive die (66) including a respective semiconductor body (68) and a respective first pad (69) electrically connected to the semiconductor body (66); and forming a first wire bonding (58) that electrically connects the first portion (12;112) of the conductive region (10;110) and the first pad (69) of the semiconductive die (66).

A process for manufacturing an electronic system may be summarized as including performing the manufacturing process of the electronic device (1;100);

fixing the MEMS sensor device (20; 120) to a semiconductive die (66) wherein an electronic circuit (79) is formed, the semiconductive die (66) being carried by a support (73) which includes a respective pad (77) electrically coupleable to the outside world; forming a first wire bonding (58) that connects the first portion (12;112) of the conductive region (10;110) and the pad (77) of the support (73).

The semiconductive die (66) may include a respective second pad (69) electrically connected to the electronic circuit (79), said process may further include forming a second wire bonding (70) that connects the pad (54; 150) of the MEMS sensor device (20;120) to said second pad (69) of the semiconductive die (66).

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:

a MEMS sensor device including:

a functional structure configured to, in operation, transduce a chemical or physical quantity into a corresponding electrical quantity;

a first semiconductive device including a first semiconductive substrate and an insulating region on the first semiconductive substrate, wherein the first semiconductive device further includes a first recess and the first recess is overlapped by the functional structure of the MEMS sensor device; and a cap including:

a second semiconductive substrate;

a second recess that extends into the second semiconductive substrate and overlaps the functional structure and overlaps the first recess; and a conductive region that extends between the second semiconductive substrate and the MEMS sensor device, the conductive region including:

a first portion that is arranged laterally with respect to the second semiconductive substrate and is exposed; and a second portion that is in contact with the second semiconductive substrate;

a bonding dielectric region mechanically couples the cap to the MEMS sensor device.

2. The device according to claim 1, wherein:

the semiconductive substrate of the cap laterally delimits a third recess overlying the first portion of the conductive region; and the first portion of the conductive region faces towards the recess and delimits the recess.

3. The device according to claim 1, wherein the MEMS sensor device includes at least one respective pad arranged laterally with respect to the cap, and the at least one respective pad is electrically coupled to the functional structure and is exposed.

4. The device according to claim 1, wherein the first recess is partially delimited by the insulating region.

5. The device according to claim 4, wherein:

the functional structure is suspended between the bottom first cavity and the top second cavity.

6. The device according to claim 5, wherein the functional structure comprises at least one array sensor sensitive to a radiation or a movable mass.

7. A device, comprising:

an electronic device including:

a MEMS sensor device including a functional structure configured to, in operation, transduce a chemical or physical quantity into a corresponding electrical quantity;

a first semiconductive device including a first semiconductive substrate and an insulating region on the first semiconductive substrate, wherein the first semiconductive device further includes a first recess and the first recess is overlapped by the functional structure of the MEMS sensor device;

a cap including:

a second semiconductive substrate;

a second recess that extends into the second semiconductive substrate and overlaps the functional structure and overlaps the first recess; and a conductive region that extends between the second semiconductive substrate and the MEMS sensor device, the conductive region including:

a first portion that is arranged laterally with respect to the second semiconductive substrate and is exposed; and a second portion that is in contact with the second semiconductive substrate;

a bonding dielectric region mechanically couples the cap to the MEMS sensor device;

a semiconductive die coupled to the electronic device by an adhesive layer between the electronic device and the semiconductive die;

a support coupled to a surface of the semiconductive die facing away from the electronic device;

a package dielectric region on the support, on the semiconductive die, and on the electronic device, and wherein the electronic device includes a surface that is exposed from the package dielectric region.

8. The device according to claim 7, wherein the semiconductive die comprises a respective pad electrically connected to the first portion of the conductive region by a wire bonding.

9. The device according to claim 7, wherein the support includes a respective pad, and the respective pad is coupled to the first portion of the conductive region by a wire bonding.

10. The device according to claim 7, wherein the semiconductive die includes an ASIC circuit.

11. The device according to claim 7, further comprising a conductive shield layer is on a surface of the second semiconductive substrate facing away from the functional structure, and the conductive shield layer at least partially overlaps the functional structures.

12. The device of claim 7, wherein the functional structure comprises at least one array sensor sensitive the movable mass.

13. A device, comprising:

a first substrate including a first surface and a second surface opposite to the first surface;

an insulating region on the first surface of the first substrate, the insulating region including a third surface facing away from the first substrate;

a conductive path in the insulating region;

a window extends into the insulating region to the conductive path;

a first cavity within the insulating region, wherein the first cavity is along the third surface of the insulating region, and the first cavity is spaced apart from the window and the conductive path;

a structural layer coupled to third surface of the insulating region, the structural layer including:

a fourth surface facing away from the insulating region;

a first main portion on the third surface of the insulating region, the first main portion includes a movable mass that is suspended over the first cavity, wherein the movable mass overlaps the first cavity within the insulating region;

a portion on the third surface, wherein the portion extends through the window and the portion is on and coupled to the conductive path;

at least one opening that extends through the structural layer and separates the first main portion of the structural layer form the portion of the structural layer;

a conductive pad on the portion of the structural layer;

a bonding layer on the first main portion and along the fourth surface of the structural layer;

a first dielectric region on the bonding layer;

a second dielectric region on the first dielectric region;

a second substrate coupled to the second dielectric region, wherein the second substrate includes a second cavity that is aligned with and overlaps the moveable mass, and wherein the second cavity is aligned with and overlaps the first cavity within the insulating region;

a conductive region including:

a first secondary portion that extends through the second dielectric region and is exposed from the second dielectric region;

a second secondary portion that extends through the second dielectric region and is exposed from the second dielectric region, and the second secondary portion is spaced apart from the first secondary portion; and a second main portion is between the first dielectric region and the second dielectric region, and the second main portion extends from the first secondary portion to the second secondary portion.

14. The device of claim 13, wherein the insulating layer includes one or more stacked insulating sub-regions.

15. The device of claim 13, wherein the first dielectric region includes one or more stacked dielectric layers.

16. The device of claim 13, wherein the structural layer includes one or more springs that suspend the movable mass from the main portion of the structural layer.

17. The device of claim 16, wherein the one or more springs and the movable mass overlap the first cavity and are overlapped by the first second cavity.

18. The device of claim 13, wherein the movable mass is suspended within a chamber that is defined by the first cavity and the second cavity.

19. The device of claim 13, wherein the first secondary portion is covered by the second substrate.

20. The device of claim 19, further comprising:

a first wire bond coupled to the conductive pad; and a second wire bond coupled to the second secondary portion.

21. The device of claim 20, further comprising:

an adhesive region on the second surface of the first substrate;

a semiconductor die including ASIC circuitry coupled to the second surface of the first substrate by the adhesive region; and a support structure coupled to the semiconductor die.

22. The device of claim 21, wherein the first wire bond couples the conductive pad to the semiconductor die.

23. The device of claim 21, wherein the second wire bond couples the conductive pad to at least one of the semiconductor die or the support structure.

* * * * *